(12) United States Patent
Hayakawa et al.

(10) Patent No.: US 12,326,666 B2
(45) Date of Patent: Jun. 10, 2025

(54) EXPOSING APPARATUS AND METHOD FOR MANUFACTURING ARTICLE

(71) Applicant: CANON KABUSHIKI KAISHA, Tokyo (JP)

(72) Inventors: Takashi Hayakawa, Tochigi (JP); Keiji Emoto, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 251 days.

(21) Appl. No.: 17/385,752

(22) Filed: Jul. 26, 2021

(65) Prior Publication Data

US 2022/0035260 A1   Feb. 3, 2022

(30) Foreign Application Priority Data

Jul. 28, 2020   (JP) .................................. 2020-127585

(51) Int. Cl.
 *G03F 7/00*   (2006.01)
(52) U.S. Cl.
 CPC .............................. *G03F 7/70725* (2013.01)
(58) Field of Classification Search
 CPC ............. G03F 7/70358; G03F 7/70425; G03F 7/70716; G03F 7/70725; G03F 7/70325; G03F 7/70366; G03F 7/70375; G03F 7/704; G03F 7/70433; G03F 7/70483; G03F 7/70491; G03F 7/705; G03F 7/70525; G03F 7/70533; G03F 7/70691; G03F 7/707; G03F 7/70733; G03F 7/70758; G03F 7/70766; G03F 7/70775; G03F 7/70791; G03F 7/708; G03F 7/70808; G03F 7/70825; G03F 7/70833; G03F 7/70858; G03F 7/70866; G03F 7/709

USPC ..................................... 355/27, 52–55, 67–77
See application file for complete search history.

(56) References Cited

U.S. PATENT DOCUMENTS

| | | | | |
|---|---|---|---|---|
| 2003/0179359 | A1* | 9/2003 | Korenaga | H02K 41/0354 355/75 |
| 2005/0218842 | A1* | 10/2005 | Yang | H02P 25/06 318/114 |
| 2008/0275661 | A1* | 11/2008 | Yang | G03F 7/70725 702/105 |

(Continued)

FOREIGN PATENT DOCUMENTS

| | | |
|---|---|---|
| CN | 1453637 A | 11/2003 |
| CN | 1470945 A | 1/2004 |

(Continued)

*Primary Examiner* — Christina A Riddle
(74) *Attorney, Agent, or Firm* — Canon U.S.A., Inc. IP Division

(57) ABSTRACT

The exposing apparatus according to the present invention for exposing a substrate so as to transfer a pattern formed on an original to the substrate by using exposure light from a light source, includes a substrate stage on which the substrate is mounted, a driving unit configured to drive the substrate stage with a plurality of actuators each configured to apply a thrust to the substrate stage in respective orientations different from each other, and a controller configured to control the driving unit to cause the substrate stage to move in the scanning direction when exposing each of a plurality of shot regions on the substrate, and to cause each of the plurality of actuators to apply the thrust to the substrate stage in at least a part of time duration of each movement in the scanning direction.

12 Claims, 5 Drawing Sheets

(56) References Cited

U.S. PATENT DOCUMENTS

2011/0149263 A1    6/2011  Roux
2012/0170008 A1*   7/2012  Emoto ................ G03F 7/70725
                                                      355/53
2018/0356738 A1*  12/2018  De Groot ............ G03F 7/70725

FOREIGN PATENT DOCUMENTS

JP        2011035381 A      2/2011
JP        2012142463 A      7/2012
JP        2019-121656 A     7/2019
WO    WO-2019096536 A1 *    5/2019   ......... G03F 7/70725

* cited by examiner

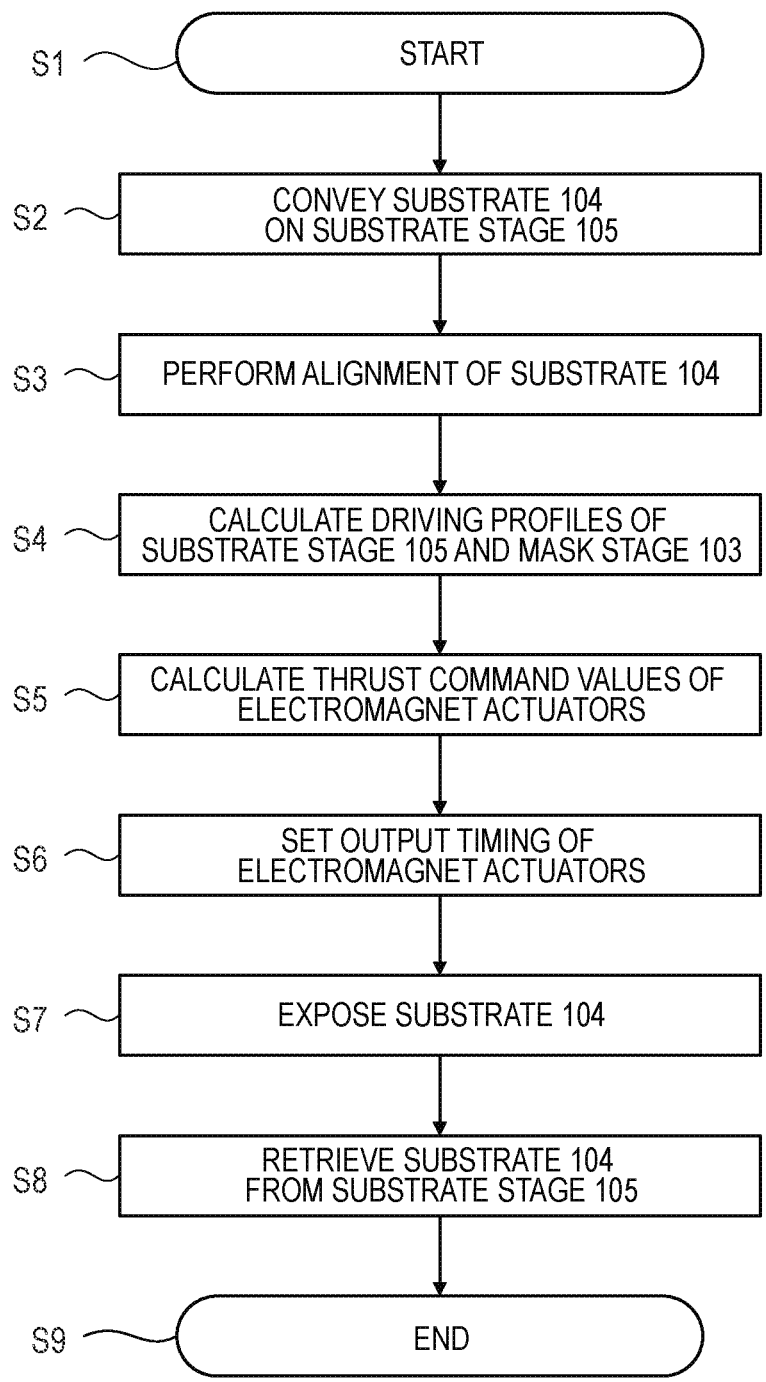

EXPOSING APPARATUS AND METHOD FOR MANUFACTURING ARTICLE

BACKGROUND

Field of the Disclosure

The present disclosure relates to an exposing apparatus and a method for manufacturing an article.

Description of the Related Art

Conventionally, an exposing apparatus for exposing a substrate mounted on a substrate stage while moving the substrate stage in a scanning direction is known.

In such an exposing apparatus, it is required to improve a productivity by increasing a throughput when exposing the substrate.

Japanese Patent Application Laid-Open No. 2012-142463 discloses an exposing apparatus which reduces an exposure time to improve a throughput by moving a substrate stage in the scanning direction while varying a speed of the substrate stage according to a driving profile formed by a sine function when exposing the substrate.

In Japanese Patent Application Laid-Open No. 2012-142463, when exposing a predetermined shot region on the substrate, the substrate stage is moved in the scanning direction such that an acceleration in the scanning direction of the substrate stage is varied from a positive value in a first section to 0 at a predetermined time and is then varied to a negative value in a second section from 0 at the predetermined time.

On the other hand, there is known an exposing apparatus in which a substrate stage is moved in the scanning direction by using a first actuator for applying a first thrust having a positive orientation in the scanning direction to the substrate stage and a second actuator for applying a second thrust having a negative orientation in the scanning direction to the substrate stage.

Here, when the substrate is exposed in such an exposing apparatus, it is conceivable that switching from the first actuator to the second actuator occurs in case that the substrate stage is moved in the scanning direction while varying a speed of the substrate stage as disclosed in Japanese Patent Application Laid-Open No. 2012-142463.

That is, the acceleration of the substrate stage becomes positive by generating only the first thrust by the first actuator in the first section, while it becomes negative by generating only the second thrust by the second actuator in the second section.

At this time, at a predetermined time when the acceleration of the substrate stage becomes zero, the generation of the second thrust starts at the same time that the generation of the first thrust is finished.

That is, when the first thrust and the second thrust become zero simultaneously at the predetermined time, a control deviation with respect to a position of the substrate stage occurs, thereby an overlay accuracy deteriorates.

SUMMARY

It is an object of the present disclosure to provide an exposing apparatus capable of suppressing the occurrence of the control deviation with respect to the position of the substrate stage while maintaining an improvement in throughput.

The exposing apparatus according to the present disclosure for exposing a substrate so as to transfer a pattern formed on an original to the substrate by using exposure light from a light source, includes a substrate stage on which the substrate is mounted, a driving unit configured to drive the substrate stage with a plurality of actuators each configured to apply a thrust to the substrate stage in respective orientations different from each other, and a controller configured to control the driving unit to cause the substrate stage to move in the scanning direction when exposing each of a plurality of shot regions on the substrate, and to cause each of the plurality of actuators to apply the thrust to the substrate stage in at least a part of time duration of each movement in the scanning direction.

Further features of the present invention will become apparent from the following description of exemplary embodiments with reference to the attached drawings.

BRIEF DESCRIPTION OF THE DRAWINGS

FIG. 3 is a flowchart showing an exposing process of a substrate in the exposing apparatus according to the first embodiment.

DESCRIPTION OF THE EMBODIMENTS

Figure 1A:
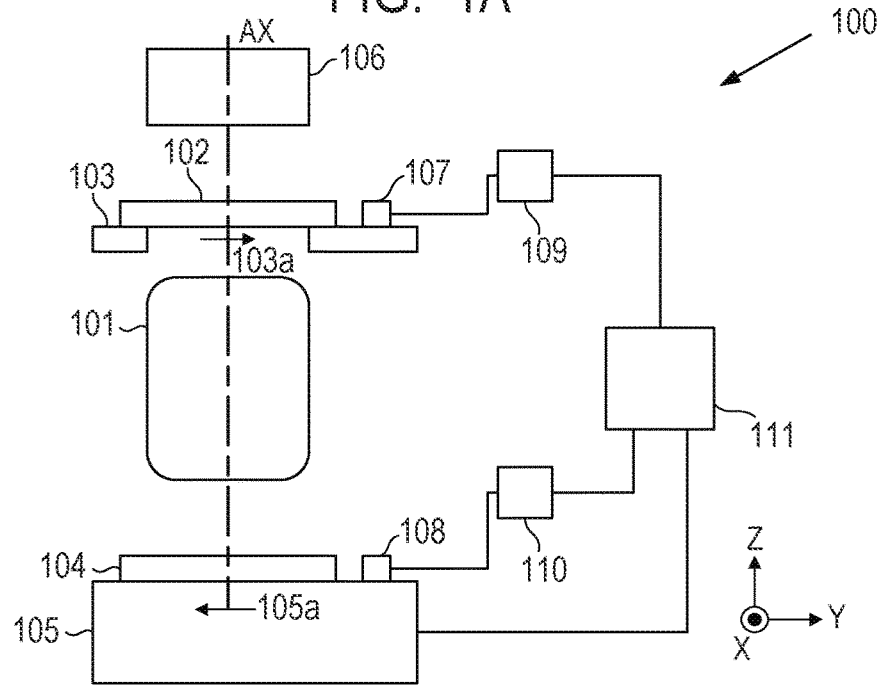
FIG. 1A is a schematic cross-sectional view of an exposing apparatus according to a first embodiment of the present invention.

The exposing apparatus according to the present disclosure will be described in detail below with reference to the attached drawings. In order to facilitate understanding of the present invention, the following drawings are drawn in a scale different from the actual scale.

In the following description, a direction perpendicular to the substrate mounting surface of the substrate stage is defined as the Z direction, and two directions orthogonal (perpendicular) to each other in the substrate mounting surface are defined as the X direction and the Y direction, respectively.

At present, as an exposing apparatus which is a manufacturing apparatus of a semiconductor device, a scanning exposing apparatus which performs an exposure while scanning a mask and a wafer with respect to an optical system is mainly used.

Further, in the exposing apparatus, an improvement in productivity is required as well as improvements in exposure accuracy and overlay accuracy.

In order to attend to such a demand, an acceleration and a velocity at which a mask stage and a substrate stage are moved in the scanning direction to perform an exposure are improved, thereby an exposure time has been shortened to improve productivity.

However, since there is a limit in hardware in order to improve the acceleration and the velocity, an exposing apparatus has been proposed which further shortens the exposure time by moving the mask stage and the substrate stage in the scanning direction while varying speeds of the mask stage and the substrate stage when performing the exposure.

On the other hand, in an exposing apparatus which moves the mask stage and the substrate stage in the scanning direction by using linear motors, an amount of heat generated in a coil used in the linear motor increases as accelerations of the mask stage and the substrate stage increase.

As a result, an accuracy of position measurement may deteriorate by a deformation of a measurement standard due to a thermal expansion occurring in the mask stage and the substrate stage, or by a disturbance of an air density in an optical path of a laser interferometer.

To solve this problem, there has been proposed an exposing apparatus which moves the mask stage and the substrate stage in the scanning direction by using an electromagnet actuator in which a small amount of heat is generated.

In such an exposing apparatus, each stage is driven in the scanning direction by using a first electromagnet actuator for generating a first thrust having a positive orientation in the scanning direction and a second electromagnet actuator for generating a second thrust having a negative orientation in the scanning direction.

Here, when exposing a predetermined shot region on the substrate, a case is considered in which the substrate stage is moved in the scanning direction such that the acceleration of the substrate stage is varied from a positive value in a first section to 0 at a predetermined time and is then varied to a negative value in a second section from 0 at the predetermined time.

At this time, it is conceivable to adopt a method in which only the first thrust is generated by the first electromagnet actuator in the first section, while only the second thrust is generated by the second electromagnet actuator in the second section.

That is, in this case, the acceleration of the substrate stage can be set to a positive value by generating only the first thrust in the first section, while the acceleration of the substrate stage can be set to a negative value by generating only the second thrust in the second section.

At this time, an instantaneous switching from the first electromagnet actuator to the second electromagnet actuator occurs when the acceleration of the substrate stage is varied from the positive value in the first section to 0 at the predetermined time and is then varied to the negative value in the second section from 0 at the predetermined time.

In this case, a control deviation may occur with respect to a position of the substrate stage by switching the actuator for driving the substrate stage instantaneously to deteriorate an overlay accuracy.

Therefore, in the exposing apparatus according to the present invention, by adopting the following structures, it is possible to suppress an occurrence of such control deviation when the substrate stage is driven according to a driving profile having an inflection point at which the acceleration (acceleration orientation) of the substrate stage switches from positive to negative.

First Embodiment

FIG. 1A shows a schematic cross-sectional view of an exposing apparatus 100 according to a first embodiment of the present invention.

The exposing apparatus 100 according to the present embodiment exposes a substrate 104 so as to transfer a pattern formed on a mask 102 (original) to the substrate 104 by using exposure light from a light source.

Here, as the substrate 104, for example, a wafer in which a resist (photoresist) is applied on a surface thereof is used, and a plurality of shot regions each of which has the same pattern structure formed by a previous exposing process are arranged on the substrate 104.

The exposing apparatus 100 according to the present embodiment employs a step and scan method in which each shot region on the substrate 104 is exposed with high accuracy while the mask 102 and the substrate 104 are moved in the scanning direction synchronously in the Y direction. In this case, an exposed area is formed in a rectangular or arcuate slit shape.

As shown in FIG. 1A, the exposing apparatus 100 according to the present embodiment includes a projecting optical system 101, a mask stage 103, a substrate stage 105, an illuminating optical system 106 and a controller 111.

The projecting optical system 101 is arranged such that an optical axis AX thereof is parallel to the Z direction, and projects an image of a pattern of the mask 102 onto an image plane of the projecting optical system 101, namely onto the substrate 104.

A magnification of the projecting optical system 101 can be selected from ¼, ½ and ⅕, for example.

The mask stage 103 is configured to hold the mask 102, and to move in a direction of an arrow 103a parallel to the Y direction in the XY plane perpendicular to the optical axis AX of the projecting optical system 101 when performing an exposure.

At this time, the mask stage 103 is driven with a correction such that a position of the mask stage 103 in the X direction is maintained at a target position.

The positions of the mask stage 103 in the X and Y directions are determined by an interferometer 109 measuring reflected light from a bar-mirror 107 disposed on the mask stage 103.

The substrate stage 105 is configured to suck and hold the substrate 104 to be mounted by using a chuck (not shown), and to move in a direction of an arrow 105a parallel to the Y direction in the XY plane perpendicular to the optical axis AX of the projecting optical system 101 when performing an exposure.

Specifically, the substrate stage 105 includes an XY stage movable in the X direction and the Y direction, and a Z stage movable in the Z direction (height direction of the substrate 104) parallel to the optical axis AX of the projecting optical system 101.

Further, the substrate stage 105 includes a leveling stage rotatable about the X and Y axes and a rotating stage rotatable about the Z axis.

Thus, in the substrate stage 105, a six-axis driving system to match an image of the pattern formed on the mask 102 to a desired shot region on the substrate 104 is provided.

The positions of the substrate stage 105 in the X, Y and Z directions are determined by an interferometer 110 measuring reflected light from a bar-mirror 108 disposed on the substrate stage 105.

The illuminating optical system 106 illuminates the mask 102 with light from a light source (not shown) which generates pulse light, such as an excimer laser.

Specifically, the illuminating optical system 106 includes a beam shaping optical system for converting a cross-sectional shape (dimension) of an incident light into a predetermined shape, and an optical integrator for making light distribution characteristics of the incident light be uniform to illuminate the mask 102 with uniform illuminance.

Further, the illuminating optical system 106 includes a masking blade, a collimator lens, a mirror and the like for defining a rectangular illuminated region corresponding to a chip size.

Thus, the illuminating optical system 106 can efficiently transmit or reflect the pulse light in far-ultraviolet region.

The controller 111 includes a CPU, a memory and the like, and is configured to overall control each component of the exposing apparatus 100 according to the present embodiment.

Specifically, the controller 111 controls driving of the mask stage 103 holding the mask 102 and driving of the substrate stage 105 holding the substrate 104 in order to condense light from the pattern formed on the mask 102 on a predetermined shot region of the substrate 104.

For example, the controller 111 adjusts the positions of the mask stage 103 and the substrate stage 105 in the XY plane (position in the X and Y directions and angle about the Z axis) and in the Z direction (respective angles about the X and Y axes).

Further, the controller 111 causes the mask stage 103 and the substrate stage 105 to move in the scanning direction synchronously when exposing a predetermined shot region on the substrate 104, and causes the substrate stage 105 to stepping-move when switching the shot region to be exposed.

Thus, the controller 111 can control an exposure process for exposing each shot region of the substrate 104 with scanning the substrate 104 held by the substrate stage 105.

When the mask stage 103 is moved in the direction of the arrow 103a, the substrate stage 105 is moved in the direction of the arrow 105a at a speed corrected by a magnification (reduction magnification) of the projecting optical system 101.

An alignment of the pattern formed on the mask 102 in the XY plane is performed based on the position of the mask stage 103, the position of the substrate stage 105, and the position of each shot region on the substrate 104 with respect to the substrate stage 105.

Here, the positions of the mask stage 103 and the substrate stage 105 are measured by the interferometers 109 and 110 as described above.

The position of each shot region on the substrate 104 with respect to the substrate stage 105 is measured by detecting a position of a mark provided on the substrate stage 105 and a position of an alignment mark formed on the substrate 104 by an alignment microscope (not shown).

Figure 1B:
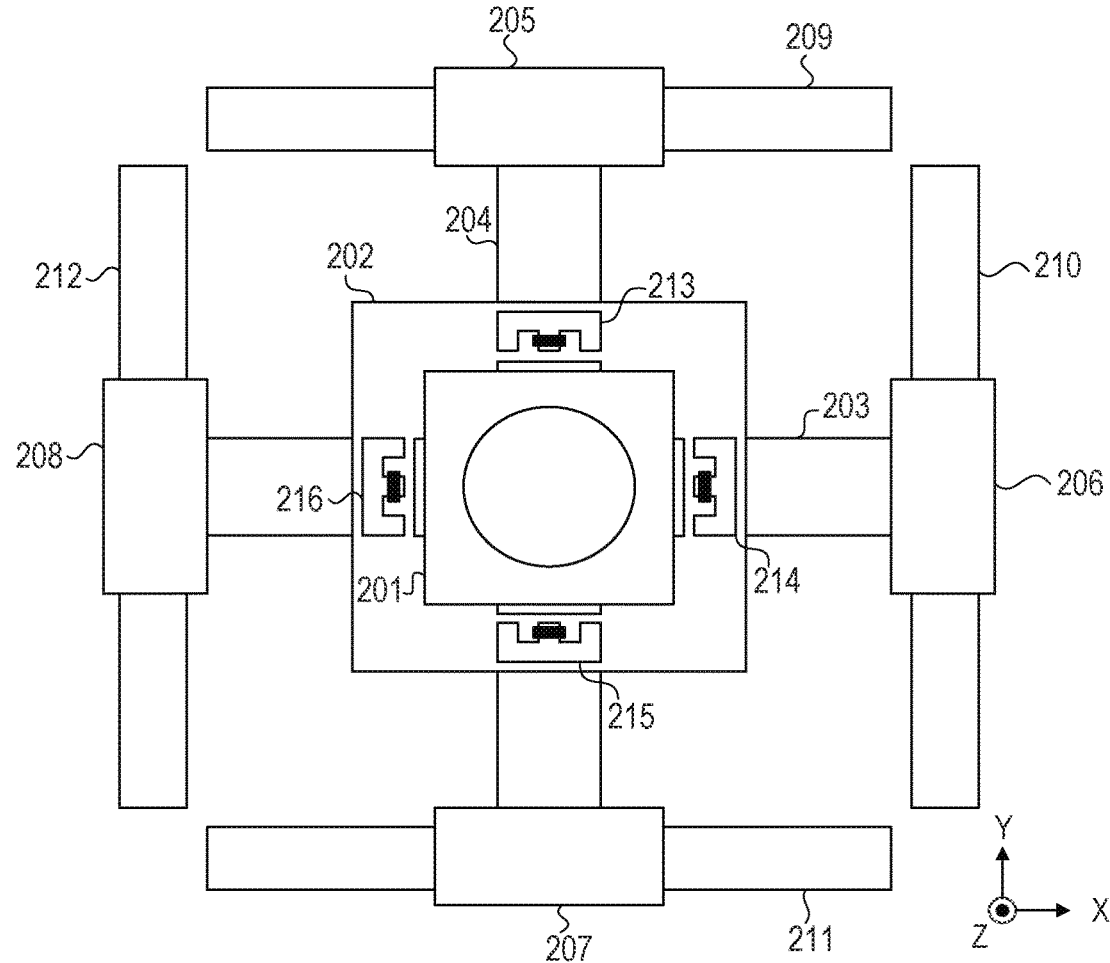
FIG. 1B is a top view of a substrate stage in the exposing apparatus according to the first embodiment.

FIG. 1B shows a top view of the substrate stage 105 provided in the exposing apparatus 100 according to the present embodiment.

As shown in FIG. 1B, the substrate stage 105 includes a fine movement stage 201 and a coarse movement stage 202, on which the substrate 104 is mounted, performing short distance driving and long distance driving, respectively.

Specifically, the coarse movement stage 202 is movably supported by a X slider 203 and a Y slider 204, and is connected to linear motor movable elements 205, 206, 207 and 208.

The linear motor movable elements 205, 206, 207 and 208 can drive the coarse movement stage 202 in the X direction and the Y direction by a Lorentz force generated between them and linear motor stators 209, 210, 211 and 212, respectively.

The fine movement stage 201 is coupled to the coarse movement stage 202 by a plurality of electromagnet actuators 213, 214, 215 and 216 in a non-contact manner so as to be movable in the X direction and the Y direction.

The electromagnet actuators 213 and 215 can drive the fine movement stage 201 in the Y direction, while the electromagnet actuators 214 and 216 can drive the fine movement stage 201 in the X direction.

The electromagnet actuators 213 to 216 can generate only an attraction force and are controlled by the controller 111.

Further, the fine movement stage 201 is driven by an XYZ linear motor (not shown) in the Z direction, the rotation direction around the X axis, the rotation direction around the Y axis, and the rotation direction around the Z axis to form a six-axis driving system.

When the fine movement stage 201 is driven in the +Y direction, that is, in a positive orientation of the Y direction, the electromagnet actuator 213 generates a thrust as an attractive force in the positive orientation of the Y direction.

On the other hand, when the fine movement stage 201 is driven in the −Y direction, that is, in a negative orientation of the Y direction, the electromagnet actuator 215 generates a thrust as an attractive force in the negative orientation of the Y direction.

When the fine movement stage 201 is driven in the +X direction, that is, in a positive orientation of the X direction, the electromagnet actuator 214 generates a thrust as an attractive force in the positive orientation of the X direction.

On the other hand, when the fine movement stage 201 is driven in the −X direction, that is, in a negative orientation of the X direction, the electromagnet actuator 216 generates a thrust as an attractive force in the negative orientation of the X direction.

That is, in the exposing apparatus 100 according to the present embodiment, each of the plurality of actuators applies a thrust in an orientation different from each other to the fine movement stage 201.

In the exposing apparatus 100 according to the present embodiment, by forming the substrate stage 105 as described above, the substrate 104 can be positioned at a high speed and with a high accuracy.

Further, in the exposing apparatus 100 according to the present embodiment, a driving unit for driving the fine movement stage 201 consists of the electromagnet actuators 213 (first actuator), 214, 215 (second actuator) and 216.

The number of the electromagnet actuators for driving the fine movement stage 201 in the Y direction is not limited to two as described above, and three or more electromagnet actuators may be used to drive the fine movement stage 201 in the Y direction.

Figure 5:
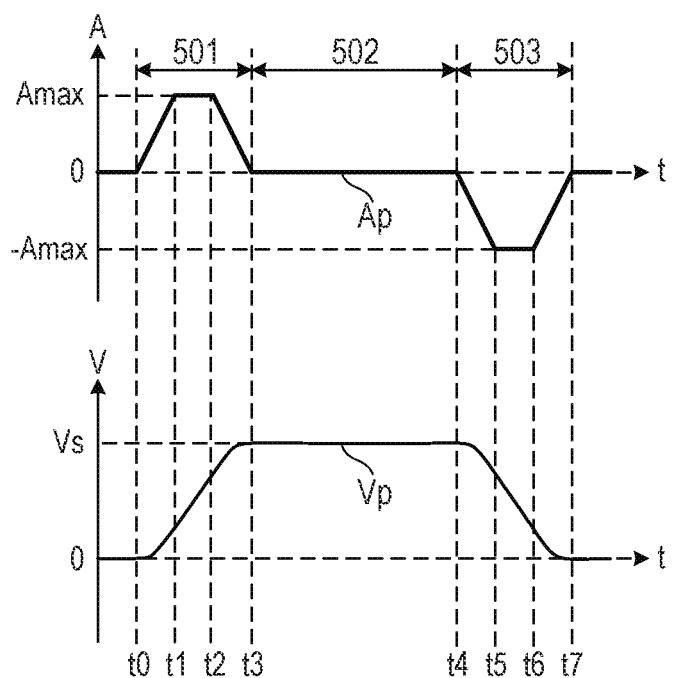
FIG. 5 is an acceleration profile and a velocity profile in a conventional exposing apparatus.

FIG. 5 shows an acceleration profile $A_p$ and a velocity profile $V_p$ in the Y direction of the fine movement stage 201 when a predetermined shot region on the substrate 104 is exposed in a conventional exposing apparatus 400.

Since the conventional exposing apparatus 400 shown here has the same configuration as that of the exposing apparatus 100 according to the present embodiment, the same members are denoted by the same reference numerals and description thereof is omitted.

Hereinafter, an acceleration A and a velocity V in the Y direction are simply referred to as the acceleration A and the velocity V, respectively.

As shown in FIG. 5, when a predetermined shot region on the substrate 104 is exposed in the exposing apparatus 400, the driving of the fine movement stage 201 is controlled by the controller 111 as follows.

Specifically, first, when the fine movement stage 201 is accelerated in the Y direction in an acceleration section 501 from a time $t_0$ to a time $t_3$, the acceleration A is increased from the time $t_0$ to a time $t_1$ so as to reach $A_{max}$ at the time $t_1$.

Then, after the acceleration A is maintained at $A_{max}$ between the time $t_1$ and a time $t_2$, the acceleration A is decreased from the time $t_2$ to the time $t_3$ such that it becomes 0 at the time $t_3$, thereby the velocity V of the fine movement stage 201 reaches an exposure velocity $V_s$.

Next, in a constant velocity section 502 from the time $t_3$ to a time $t_4$, the predetermined shot region on the substrate 104 is exposed with scanning in maintaining the velocity V of the fine movement stage 201 in the Y direction at the exposure velocity $V_s$.

When the fine movement stage 201 is decelerated in the Y direction in a deceleration section 503 from the time $t_4$ to a time $t_7$, the acceleration A is decreased from the time $t_4$ to a time $t_5$ so as to reach $-A_{max}$ at the time $t_5$.

Thereafter, the acceleration A is maintained at $-A_{max}$ between the time $t_5$ and a time $t_6$, and finally the acceleration A is increased from the time $t_6$ to the time $t_7$ such that it becomes 0 at the time $t_7$, thereby the velocity V of the fine movement stage 201 reaches 0.

Then, by sequentially repeating the driving as described above and stepping-driving, a plurality of shot regions provided on the entire substrate 104 can be exposed.

Here, in order to improve a productivity, it is conceivable to shorten a time period for processing one substrate 104 by shortening a time period in each of the acceleration section 501, the exposure section 502 and the deceleration section 503 by improving the exposure velocity $V_s$ and the maximum acceleration $A_{max}$.

However, since an improvement of the maximum acceleration $A_{max}$ is limited in hardware, the improvement of productivity is also limited.

Figure 6A:
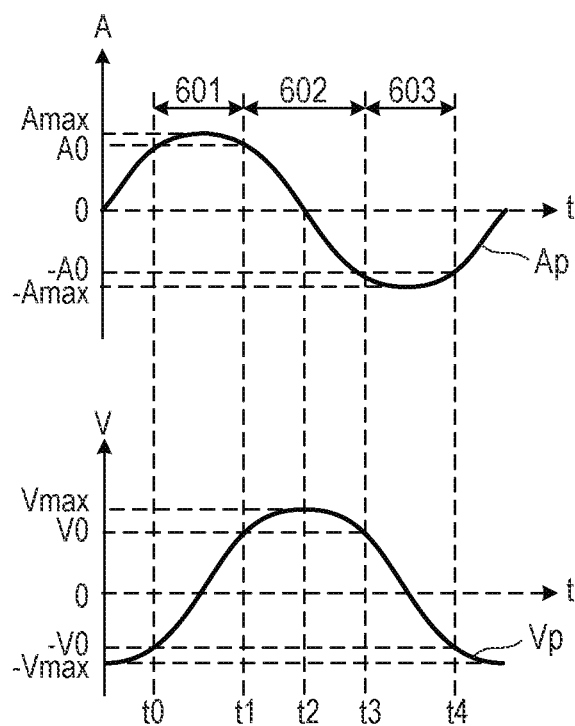
FIG. 6A is an acceleration profile and a velocity profile in another conventional exposing apparatus.

FIG. 6A shows an acceleration profile $A_p$ and a velocity profile $V_p$ in the Y direction of the fine movement stage 201 when a predetermined shot region on the substrate 104 is exposed in another conventional exposing apparatus 500.

Since the another conventional exposing apparatus 500 shown here has the same configuration as that of the exposing apparatus 100 according to the present embodiment, the same members are denoted by the same reference numerals and description thereof is omitted.

Hereinafter, an acceleration A, a velocity V and a thrust F in the Y direction are simply referred to as the acceleration A, the velocity V and the thrust F, respectively.

In the exposing apparatus 500, by changing the acceleration A periodically according to a sine function, the velocity V also changes periodically. Note that FIG. 6A shows only time dependence of acceleration A and velocity V in one period.

Specifically, first, it is assumed that the acceleration A and the velocity V are $A_0$ and $-V_0$ at a predetermined time to, respectively.

In a velocity varying section 601, the acceleration A increases to $A_{max}$ and then decreases to $A_0$ during a period from the time $t_0$ to a time $t_1$, thereby the velocity V increases from $-V_0$ to $V_0$.

Next, in an exposure section 602, the acceleration A decreases to $-A_0$ during a period from the time $t_1$ to a time $t_3$, thereby the velocity V increases from $V_0$ to $V_{max}$ and then decreases to $V_0$.

Then, in the velocity varying section 603, the acceleration A decreases to $-A_{max}$ and then increases to $-A_0$ during a period from the time $t_3$ to a time $t_4$, thereby the velocity V decreases from $V_0$ to $-V_0$.

At this time, in the exposing apparatus 500, the exposure section 602 is set such that a time $t_2$ at which the acceleration A and the velocity V reach 0 and $V_{max}$, respectively, is set at a middle of the time $t_1$ and the time $t_3$, that is, is set as $(t_1+t_3)/2$.

By exposing the predetermined shot region on the substrate 104 in the exposure section 602, a stable exposure can be performed with maintaining the scanning speed of the fine movement stage 201 at a substantially constant speed. At this time, a center of the predetermined shot region is exposed at the time $t_2$.

In this way, in the exposing apparatus 500, the periods of the velocity varying section 601, the exposure section 602 and the velocity varying section 603 can be shortened by performing the exposure with varying the speed.

Thereby, the time for processing one substrate 104 can be shortened.

Figure 6B:
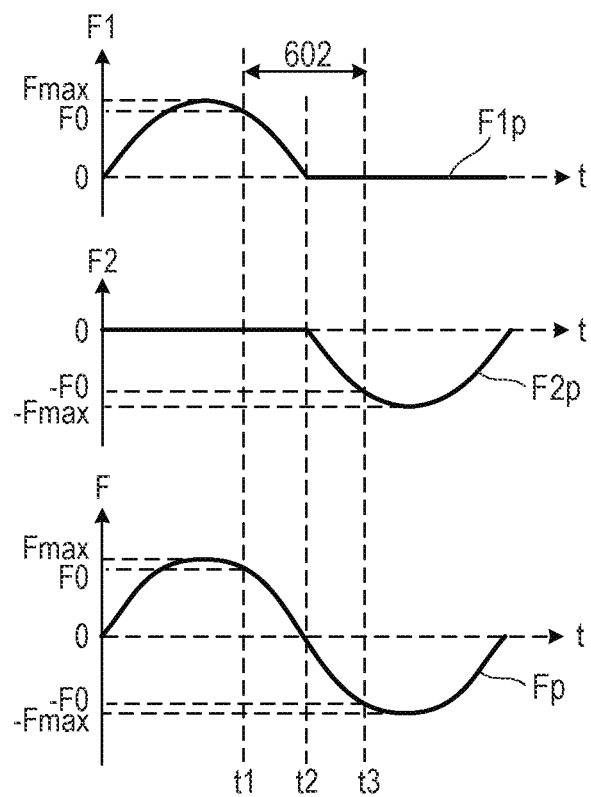
FIG. 6B is a thrust profile and a total thrust profile in the another conventional exposing apparatus.

FIG. 6B shows thrust profiles $F_{1p}$ and $F_{2p}$ of the electromagnet actuators 213 and 215, respectively, and a total thrust profile $F_p$ of the electromagnet actuators 213 and 215 in the exposing apparatus 500.

Note that a thrust $F_1$ of the electromagnet actuator 213 is shown as a positive value to drive the fine movement stage 201 in the +Y direction, while a thrust $F_2$ of the electromagnet actuator 215 is shown as a negative value to drive the fine movement stage 201 in the -Y direction.

As shown in FIG. 6B, the total thrust profile $F_p$ (time dependence of a total thrust F) of the electromagnet actuators 213 and 215 is output based on the acceleration profile $A_p$ (time dependence of the acceleration A) of the fine movement stage 201.

That is, the total thrust profile $F_p$ of the electromagnet actuators 213 and 215 changes in the same period and phase as the acceleration profile $A_p$ such that the total thrust F becomes $\pm F_{max}$ when the acceleration A of the fine movement stage 201 becomes $\pm A_{max}$.

The thrust profiles $F_{1p}$ and $F_{2p}$ of the electromagnet actuators 213 and 215 are distributed from the total thrust profile $F_p$ such that their sum forms the total thrust profile $F_p$ of the electromagnet actuators 213 and 215.

At this time, as a method of distributing the total thrust profile $F_p$ to the respective thrust profiles $F_{1p}$ and $F_{2p}$, conventionally, a distributing method according to a positive and negative of the total thrust F is employed.

That is, as shown in FIG. 6B, in a section before the time $t_2$ where the total thrust F is positive so as to drive the fine movement stage 201 in the +Y direction, the electromagnet actuator 213 generates the thrust $F_1$ as an attractive force.

On the other hand, in a section after the time $t_2$ where the total thrust F is negative so as to drive the fine movement stage 201 in the -Y direction, the electromagnet actuator 215 generates the thrust $F_2$ as an attractive force.

In this way, the electromagnet actuators 213 and 215 are controlled such that only one of the electromagnet actuators 213 and 215 generates a thrust according to a sign of the acceleration A of the fine movement stage 201.

Therefore, as shown in FIG. 6B, after the thrust $F_1$ of the electromagnet actuator 213 which is $F_0$ at the time $t_1$ starts to decrease, it reaches 0 at the time $t_2$ and then is maintained at 0 after the time $t_2$ in the exposure section 602.

On the other hand, the thrust $F_2$ of the electromagnet actuator 215 which is 0 at the time $t_1$ starts to decrease from the time $t_2$ and then reaches $-F_0$ at the time $t_3$ in the exposure section 602.

As shown in FIG. 6B, since the sum of the thrust profiles $F_{1p}$ and $F_{2p}$ forms the total thrust profile $F_p$, the thrust $F_1$ of the electromagnet actuator 213 abruptly changes at the time $t_2$.

In other words, the thrust profile $F_{1p}$ (time dependence of the thrust $F_1$) of the electromagnet actuator 213 has a discontinuity with respect to a differentiation at the time $t_2$.

Similarly, the thrust $F_2$ of the electromagnet actuator 215 abruptly changes at the time $t_2$. In other words, the thrust profile $F_{2p}$ (time dependence of the thrust $F_2$) of the electromagnet actuator 215 also has a discontinuity with respect to a differentiation at the time $t_2$.

In still other words, in the exposing apparatus 500, the thrust profiles $F_{1p}$ and $F_{2p}$ in the exposure section 602 are generated from a function which is not differentiable with respect to time at the time $t_2$ at which the thrusts $F_1$ and $F_2$ become 0, respectively.

That is, when the acceleration A continuously varies as in the acceleration profile $A_p$ of the fine movement stage 201 in the exposing apparatus 500, there is an inflection point $t_2$ at which the acceleration A instantaneously switches from positive to negative in the exposure section 602.

At the inflection point $t_2$, the thrust $F_1$ of the electromagnet actuator 213 reaches 0 with a discontinuity with respect to a differentiation, and at the same time, the thrust $F_2$ of the electromagnet actuator 215 also starts to change from 0 with a discontinuity with respect to a differentiation.

Therefore, since the application of thrust to the fine movement stage 201 is instantaneously switched from the electromagnet actuator 213 to the electromagnet actuator 215 at the inflection point $t_2$, there is a possibility that a control deviation occurs in the fine movement stage 201.

That is, in the exposing apparatus 500, the control deviation occurs in the fine movement stage 201 in the exposure section 602 where an exposure is performed, thereby an overlay accuracy deteriorates.

Therefore, in the exposing apparatus 100 according to the present embodiment, by performing a control as described below, it is possible to suppress the occurrence of such control deviation in the fine movement stage 201.

Figure 2A:
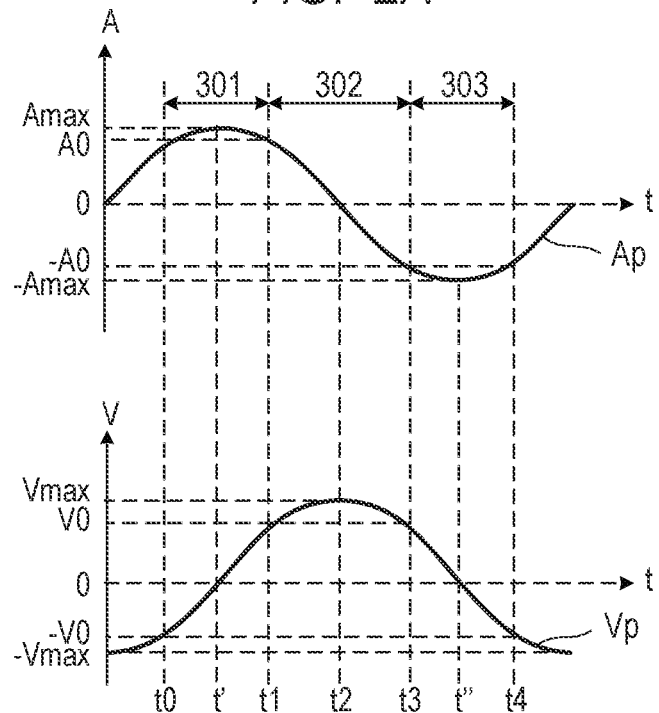
FIG. 2A is an acceleration profile and a velocity profile in the exposing apparatus according to the first embodiment.

FIG. 2A shows an acceleration profile $A_p$ and a velocity profile $V_p$ in the Y direction of the fine movement stage 201 when a predetermined shot region on the substrate 104 is exposed in the exposing apparatus 100 according to the present embodiment.

Hereinafter, the acceleration A, the velocity V, and the thrust F in the Y direction are simply referred to as the acceleration A, the velocity V, and the thrust F, respectively.

In the exposing apparatus 100 according to the present embodiment, by setting the acceleration A of the fine movement stage 201 to change periodically according to a sine function, the velocity V of the fine movement stage 201 also changes periodically. Note that FIG. 2A shows only time dependence of acceleration A and velocity V in one period.

Specifically, first, it is assumed that the acceleration A and the velocity V are $A_0$ and $-V_0$ at a predetermined time to, respectively.

In the velocity varying section 301 during a period from the time $t_0$ to a time $t_1$, the acceleration A increases to $A_{max}$ at a time t' and then decreases to $A_0$ at the time $t_1$, thereby the velocity V increases from $-V_0$ to $V_0$.

Next, in the exposure section 302 during a period from the time $t_1$ to a time $t_3$, the acceleration A decreases to 0 at a time $t_2$ and then further decreases to $-A_0$ at the time $t_3$, thereby the velocity V increases from $V_0$ to $V_{max}$ and then decreases to $V_0$.

Then, in the velocity varying section 303 during a period from the time $t_3$ to a time $t_4$, the acceleration A decreases to $-A_{max}$ at a time t" and then increases to $-A_0$ at the time $t_4$, thereby the velocity V decreases from $V_0$ to $-V_0$.

At this time, in the exposing apparatus 100 according to the present embodiment, the exposure section 302 is set such that the time $t_2$ at which the acceleration A and the velocity V reach 0 and $V_{max}$, respectively, is set at a middle of the time $t_1$ and the time $t_3$, that is, is set as $(t_1+t_3)/2$.

In the exposing apparatus 100 according to the present embodiment, by exposing the predetermined shot region on the substrate 104 in the exposure section 302, a stable exposure can be performed with maintaining a scanning speed of the fine movement stage 201 at a substantially constant speed. At this time, a center of the predetermined shot region is exposed at the time $t_2$.

In this way, in the exposing apparatus 100 according to the present embodiment, the periods of the velocity varying section 301, the exposure section 302 and the velocity varying section 303 can be shortened by performing the exposure with varying the speed.

Thereby, the time for processing one substrate 104 can be shortened.

As shown in FIG. 2A, in the exposing apparatus 100 according to the present embodiment, the acceleration profile $A_p$ in the exposure section 302 is generated from a differentiable function with respect to time.

In other words, in the exposing apparatus 100 according to the present embodiment, the acceleration profile $A_p$ in the exposure section 302 is generated from a function A(t) depending on time t in which a value of dA(t)/dt exists at any time in the exposure section 302.

Figure 2B:
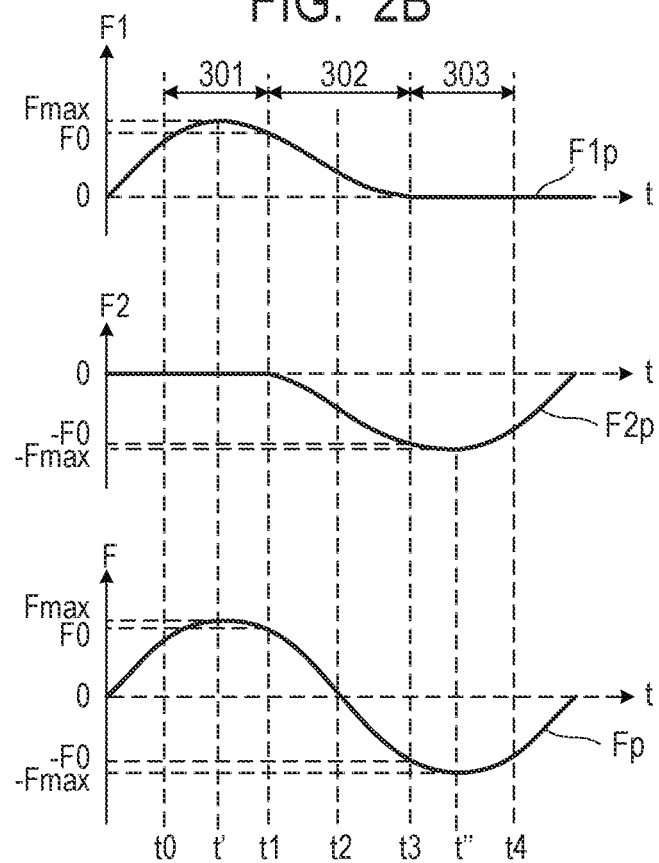
FIG. 2B is a thrust profile and a total thrust profile in the exposing apparatus according to the first embodiment.

FIG. 2B shows thrust profiles $F_{1p}$ and $F_{2p}$ of the electromagnet actuators 213 and 215, respectively, and a total thrust profile $F_p$ of the electromagnet actuators 213 and 215 in the exposing apparatus 100 according to the present embodiment.

As shown in FIG. 2B, the total thrust profile $F_p$ of the electromagnet actuators 213 and 215 is generated based on the acceleration profile $A_p$ of the fine movement stage 201.

That is, the total thrust profile $F_p$ of the electromagnet actuators 213 and 215 changes in the same period and phase as the acceleration profile $A_p$ such that the total thrust F becomes $\pm F_{max}$ when the acceleration A of the fine movement stage 201 becomes $\pm A_{max}$.

The thrust profiles $F_{1p}$ and $F_{2p}$ of the electromagnet actuators 213 and 215 are distributed from the total thrust profile $F_p$ such that their sum forms the total thrust profile $F_p$ of the electromagnet actuators 213 and 215.

In other words, the thrust profiles $F_{1p}$ and $F_{2p}$ of the electromagnet actuators 213 and 215 are generated based on an acceleration command value generated from the acceleration profile $A_p$ of the fine movement stage 201.

At this time, the exposing apparatus 100 according to the present embodiment performs a distribution of the total thrust profile $F_p$ to the thrust profiles $F_{1p}$ and $F_{2p}$ such that the respective thrusts $F_1$ and $F_2$ of the electromagnet actuators 213 and 215 do not become 0 simultaneously in the exposure section 302.

Specifically, for example, the thrust $F_1$ (first thrust) of the electromagnet actuator 213 (first actuator) which is $F_{max}$ at the time t' becomes $F_0$ at the time $t_1$ at which the exposure section 302 starts, and then monotonically decreases so as to reach 0 at the time $t_3$.

On the other hand, the thrust $F_2$ (second thrust) of the electromagnet actuator 215 (second actuator) which is 0 starts to decrease from the time $t_1$, becomes $-F_0$ at the time $t_3$ at which the exposure section 302 is finished, and then monotonically decreases so as to reach $-F_{max}$ at the time t".

Thereby, the thrust applied to the fine movement stage 201 can be controlled such that the actuator applying the thrust to the fine movement stage 201 is not switched instantaneously from the electromagnet actuator 213 to the electromagnet actuator 215 at the time $t_2$.

That is, in the exposing apparatus 100 according to the present embodiment, when one of the thrusts of the electromagnet actuators 213 and 215 reaches 0 or starts to change from 0 in the exposure section 302, the other thrust is generated.

In other words, in the exposing apparatus 100 according to the present embodiment, both of the thrust $F_1$ and $F_2$ of the electromagnet actuators 213 and 215 are not 0 in at least a part of the exposure section 302.

In still other words, in the exposing apparatus 100 according to the present embodiment, the total thrust of the electromagnet actuators 213 and 215 is applied to the fine movement stage 201 in at least a part of the exposure section 302.

That is, when each of a part of the shot regions on the substrate 104 is exposed, the acceleration profile $A_p$ is generated such that the acceleration A in the Y direction of the fine movement stage 201 is varied from a positive value in a section to 0 at a predetermined time and is then varied to a negative value in a section from 0 at the predetermined time.

Similarly, when each of the remaining shot regions on the substrate 104 is exposed, an acceleration profile $A_p$ is generated such that the acceleration A in the Y direction of the fine movement stage 201 is varied from a negative value in a section to 0 at a predetermined time and is then varied to a positive value in a section from 0 at the predetermined time.

In the exposing apparatus 100 according to the present embodiment, the controller 111 controls the driving unit to cause the fine movement stage 201 to move in the scanning direction according to the generated acceleration profile $A_p$.

At this time, in the exposing apparatus 100 according to the present embodiment, the driving unit is controlled such that each of the plurality of actuators applies a thrust to the fine movement stage 201 in at least a part of time duration of each movement in the scanning direction when exposing a plurality of shot regions on the substrate 104.

In particular, at a predetermined time when the acceleration A becomes 0 in each movement in the scanning direction when exposing the plurality of shot regions on the substrate 104, the driving unit is controlled such that each of the plurality of actuators applies the thrust to the fine movement stage 201.

As a result, in the exposing apparatus 100 according to the present embodiment, it is possible to suppress an occurrence of a control deviation in the fine movement stage 201 in the exposure section 302 in which the exposure is performed, and it is possible to suppress a deterioration of an overlay accuracy.

In the exposing apparatus 100 according to the present embodiment, as shown in FIG. 2B, it is preferred that the thrust $F_1$ of the electromagnet actuator 213 is changed continuously with respect to a differentiation when it reaches 0 at the time $t_3$.

Similarly, it is preferred that the thrust $F_2$ of the electromagnet actuator 215 is changed continuously with respect to a differentiation from 0 at the time $t_1$.

In other words, each of the thrust profiles $F_{1p}$ and $F_{2p}$ in the exposure section 302 is preferably generated from a differentiable function with respect to time.

Thereby, it is possible to further suppress the occurrence of the control deviation in the fine movement stage 201 in the exposure section 302 in which the exposure is performed, and it is possible to further suppress the deterioration of the overlay accuracy.

Further, specifically, for example, the thrust profiles $F_{1p}$ and $F_{2p}$ of the electromagnet actuators 213 and 215 in the exposure section 302 can be expressed as the following equations (1) and (2).

$$F_{1p} = \frac{F_{max}}{4}\left[1 + \cos\left(\frac{t-t'}{t_3-t'}\pi\right)\right]^2 \quad (1)$$

$$F_{2p} = -\frac{F_{max}}{4}\left[1 - \cos\left(\frac{t-t_1}{t''-t_1}\pi\right)\right]^2 \quad (2)$$

FIG. 3 is a flowchart showing the exposing process of the substrate 104 in the exposing apparatus 100 according to the present embodiment.

As shown in FIG. 3, when the exposing process of the substrate 104 is started (Step S1), the substrate 104 is conveyed onto the substrate stage 105 (Step S2).

Next, the controller 111 performs an alignment of the substrate 104 (Step S3), and calculates driving profiles of the substrate stage 105 and the mask stage 103 from layout information of shot regions exposed on the substrate 104 (Step S4).

Then, thrust command values of the electromagnet actuators provided in each stage are calculated from the driving profiles of the substrate stage 105 and the mask stage 103 calculated in step S4 (Step S5), and an output timing thereof is set (Step S6).

Thereafter, the substrate stage 105 and the mask stage 103 are driven based on the thrust command values and the output timing of the electromagnet actuators calculated in steps S5 and S6. By repeating the scanning and a stepping, each shot region on the substrate 104 is exposed (Step S7).

When the exposure for all shot regions on the substrate 104 is completed, the substrate 104 is retrieved from the substrate stage 105 (Step S8), and the exposing process for the substrate 104 is finished (Step S9).

As described above, in the exposing apparatus 100 according to the present embodiment, the driving unit is controlled such that each of a plurality of actuators applies a thrust to the fine movement stage 201 in at least a part of the time duration of each movement in the scanning direction when exposing a plurality of shot regions on the substrate 104.

Thereby, the electromagnet actuators 213 and 215 are not switched from one to another at a sign inversion of the total thrust F at the time $t_2$ in the exposure section 302.

Therefore, it is possible to suppress the occurrence of the control deviation in the fine movement stage 201 in the exposure section 302 in which the exposure is performed, and it is possible to suppress the deterioration of the overlay accuracy.

In the exposing apparatus 100 according to the present embodiment, the thrust profiles $F_{1p}$ and $F_{2p}$ of the electromagnet actuators 213 and 215 in the exposure section 302 are generated from the functions shown in Equations (1) and (2). However, the thrust profiles $F_{1p}$ and $F_{2p}$ are not limited to them as long as the above-described conditions are satisfied.

Further, the above-described control method can be similarly applied to the driving in the X direction of the fine movement stage 201 by the electromagnet actuators 214 and 216 or the driving of the mask stage 103.

Second Embodiment

Figure 4:
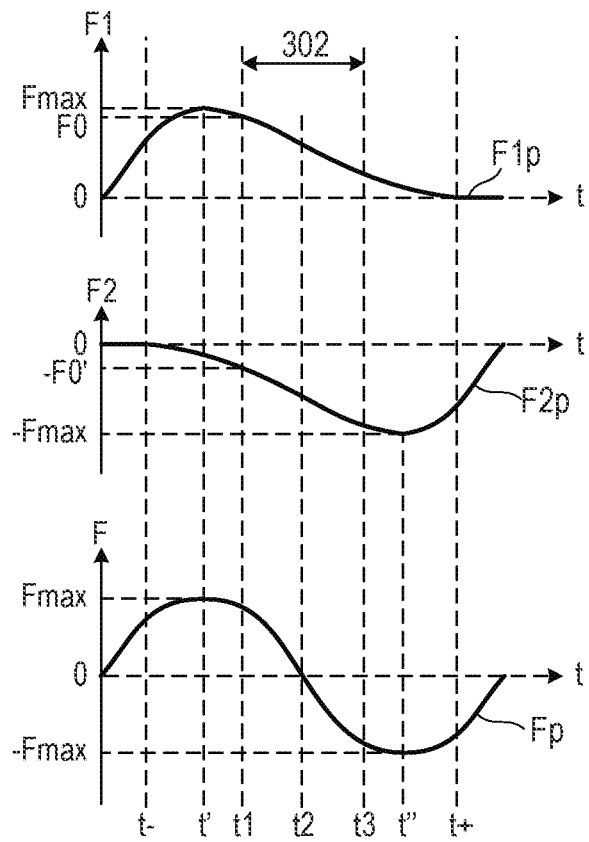
FIG. 4 is a thrust profile and a total thrust profile in an exposing apparatus according to a second embodiment of the present invention.

FIG. 4 shows thrust profiles $F_{1p}$ and $F_{2p}$ of the electromagnet actuators 213 and 215, respectively, and a total thrust profile $F_p$ of the electromagnet actuators 213 and 215 in the exposing apparatus according to a second embodiment of the present invention.

Since the exposing apparatus according to the present embodiment shown here has the same configuration as that of the exposing apparatus 100 according to the first embodiment, the same members are denoted by the same reference numerals and description thereof is omitted.

Further, since an acceleration profile $A_p$ and a velocity profile $V_p$ in the Y direction of the fine movement stage 201 when a predetermined shot region on the substrate 104 is exposed in the exposing apparatus according to the present embodiment are the same as those in the exposing apparatus 100 according to the first embodiment, description thereof is omitted.

Furthermore, since the total thrust profile $F_p$ of the electromagnet actuators 213 and 215 in the exposing apparatus according to the present embodiment is the same as that in the exposing apparatus 100 according to the first embodiment, description thereof is omitted.

As shown in FIG. 4, in the exposing apparatus according to the present embodiment, similarly to the exposing apparatus 100 according to the first embodiment, one of thrusts of the electromagnet actuators 213 and 215 is generated when the other of thrusts reaches 0 or starts to change from 0 in the exposure section 302.

In other words, in the exposing apparatus according to the present embodiment, both of the thrusts $F_1$ and $F_2$ of the electromagnet actuators 213 and 215 are not 0 in at least a part of the exposure section 302.

In still other words, in the exposing apparatus according to the present embodiment, the total thrust of the electromagnet actuators 213 and 215 is applied to the fine movement stage 201 in at least a part of the exposure section 302.

However, in the exposing apparatus according to the present embodiment, unlike the exposing apparatus 100 according to the first embodiment, the thrust $F_1$ of the electromagnet actuator 213 reaches 0 at a time after the exposure section 302.

On the other hand, the thrust $F_2$ of the electromagnet actuator 215 starts to decrease from a time before the exposure section 302.

Specifically, the thrust $F_1$ of the electromagnet actuator 213 which is $F_{max}$ at the time t' becomes $F_0$ at the time $t_1$ at which the exposure section 302 starts, and then monotonically decreases so as to reach 0 at a time $t_+$ after the exposure section 302.

On the other hand, the thrust $F_2$ of the electromagnet actuator 215 which is 0 starts to decrease from a time t before the exposure section 302, becomes $-F_0'$ at the time $t_1$ at which the exposure section 302 starts, and then monotonically decreases so as to reach $-F_{max}$ at the time t".

As described above, in the exposing apparatus according to the present embodiment, the time when each of the thrusts $F_1$ and $F_2$ of the electromagnet actuators 213 and 215 reaches 0 or start to change from 0 is set in the velocity varying section 301 or 303 other than the exposure section 302.

In other words, in the exposing apparatus according to the present embodiment, the driving unit is controlled such that each of the plurality of actuators applies a thrust to the fine movement stage 201 at any time of each movement in the scanning direction when exposing a plurality of shot regions on the substrate 104.

Thereby, an occurrence of a control deviation in the fine movement stage 201 that may occur when each of the electromagnet actuators 213 and 215 is turned on or off such that the thrust reaches 0 or starts to change from 0 in the exposure section 302 can be also suppressed.

Further, in the exposing apparatus according to the present embodiment, as shown in FIG. 4, it is preferred that the thrust $F_1$ of the electromagnet actuator 213 is changed continuously with respect to a differentiation when it reaches 0 at the time $t_+$. In other words, the thrust $F_1$ of the electromagnet actuator 213 is preferably generated from a differentiable function with respect to time t at the time $t_+$.

Similarly, it is preferred that the thrust $F_2$ of the electromagnet actuator 215 is changed continuously with respect to a differentiation from 0 at the time t. In other words, the thrust $F_2$ of the electromagnet actuator 215 is preferably generated from a differentiable function with respect to time t at the time t.

As described above, in the exposing apparatus according to the present embodiment, the driving unit is controlled such that each of a plurality of actuators applies a thrust to the fine movement stage 201 at any time of each movement in the scanning direction when exposing a plurality of shot regions on the substrate 104.

Thereby, it is possible to further suppress the occurrence of the control deviation in the fine movement stage 201 in the exposure section 302 in which the exposure is performed, and it is possible to further suppress a deterioration of an overlay accuracy.

According to the present invention, it is possible to provide an exposing apparatus capable of suppressing the occurrence of the control deviation with respect to the position of the substrate stage while maintaining the improvement in throughput.

[Method for Manufacturing Article]

A method for manufacturing an article using the exposing apparatus according to the present invention is suitable for manufacturing a device, such as a semiconductor element, a magnetic storage medium and a liquid crystal display element.

The method for manufacturing an article according to the present invention includes a step of exposing a substrate on which a photoresist is applied by using the exposing apparatus according to the present invention, and a step of developing the exposed substrate.

Further, the method for manufacturing an article according to the present invention includes other known steps (oxidation, coating, deposition, doping, planarization, etching, resist removal, dicing, bonding, packaging or the like.) for processing the developed substrate.

The method for manufacturing an article according to the present invention is advantageous in at least one of a performance, a quality, a productivity and a production cost of the article as compared with a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-127585, filed Jul. 28, 2020, which is hereby incorporated by reference herein in its entirety.

What is claimed is:

1. An exposing apparatus for exposing a substrate so as to transfer a pattern formed on an original to the substrate by using exposure light from a light source, comprising:
   a substrate stage on which the substrate is mounted;
   a projecting optical system configured to project an image of the pattern onto the substrate;
   a driving unit configured to drive the substrate stage in a first direction perpendicular to an optical axis of the projecting optical system and a second direction perpendicular to the optical axis and the first direction, the driving unit including a first actuator configured to apply a first thrust in the first direction to a first side of the substrate stage, a second actuator configured to apply a second thrust in the first direction to a second side, opposite to the first side, of the substrate stage, a third actuator configured to apply a third thrust in the second direction to a third side of the substrate stage, and a fourth actuator configured to apply a fourth thrust in the second direction to a fourth side, opposite to the third side, of the substrate stage; and
   a controller configured to control the driving unit such that the substrate stage is moved to expose a plurality of shot regions on the substrate by performing a first drive in the first direction with the first actuator and the second actuator, and a second drive in the second direction with the third actuator and the fourth actuator,
   wherein the controller causes the first actuator to apply the first thrust to the first side in a first orientation of the first direction and causes the second actuator to apply the second thrust to the second side in a second orientation opposite to the first orientation of the first direction to move the substrate stage in the first direction, and
   wherein the controller controls the driving unit such that a total thrust of the first thrust and the second thrust changes according to a sine function by changing each of the first thrust and the second thrust, and any of a magnitude of the first thrust and a magnitude of the second thrust does not become 0 when an orientation of the total thrust changes in the first drive.

2. The exposing apparatus according to claim 1, wherein the controller controls the driving unit to cause the substrate stage to move in the first direction in accordance with an acceleration profile generated such that an acceleration in the first direction is varied from a positive value in a section to 0 at a predetermined time, and is then varied to a negative value in a section from 0 at the predetermined time when each of a part of the shot regions on the substrate is exposed.

3. The exposing apparatus according to claim 2, wherein the controller controls the driving unit to cause the substrate stage to move in the first direction in accordance with the acceleration profile generated such that the acceleration in the first direction is varied from a negative value in a section to 0 at a predetermined time, and is then varied to a positive value in a section from 0 at the predetermined time when each of remaining shot regions on the substrate is exposed.

4. The exposing apparatus according to claim 2, wherein the controller generates the acceleration profile when exposing each of the plurality of shot regions from a differentiable function with respect to time.

5. The exposing apparatus according to claim 2, wherein the controller generates a thrust profile of each of the first actuator and the second actuator based on an acceleration command value generated from the acceleration profile when exposing each of the plurality of shot regions.

6. The exposing apparatus according to claim 5, wherein the controller generates the thrust profile of each of the first actuator and the second actuator when exposing each of the plurality of shot regions from a differentiable function with respect to time.

7. The exposing apparatus according to claim 2, wherein the controller controls the driving unit such that the first actuator and the second actuator apply the first thrust and the second thrust to the substrate stage at the predetermined time, respectively.

8. The exposing apparatus according to claim 1, wherein the controller controls the driving unit such that the first actuator and the second actuator apply the first thrust and the second thrust to the substrate stage at any time of each movement in the first direction, respectively.

9. The exposing apparatus according to claim 1, wherein each of the first actuator and the second actuator is an electromagnet actuator.

10. A method for manufacturing an article, comprising:
    exposing the substrate by using the exposing apparatus according to claim 1;
    developing the exposed substrate; and
    processing the developed substrate to manufacture an article.

11. The exposing apparatus according to claim 1,
    wherein the total thrust of the first thrust and the second thrust is applied to the substrate stage in the first orientation in a first period in the first drive, whereas the total thrust of the first thrust and the second thrust is applied to the substrate stage in the second orientation in a second period after the first period in the first drive, and
    wherein the magnitude of the total thrust of the first thrust and the second thrust becomes 0 between the first period and the second period.

12. A method for exposing a substrate so as to transfer a pattern formed on an original to the substrate by using exposure light from a light source in an exposing apparatus including a substrate stage on which the substrate is mounted, a projecting optical system configured to project an image of the pattern onto the substrate and a driving unit configured to drive the substrate stage in a first direction perpendicular to an optical axis of the projecting optical system and a second direction perpendicular to the optical axis and the first direction, and including a first actuator configured to apply a first thrust in the first direction to a first side of the substrate stage, a second actuator configured to apply a second thrust in the first direction to a second side, opposite to the first side, of the substrate stage a third actuator configured to apply a third thrust in the second direction to a third side of the substrate stage, and a fourth actuator configured to apply a fourth thrust in the second direction to a fourth side, opposite to the third side, of the substrate stage, comprising:
    controlling the driving unit such that the substrate stage is moved to expose a plurality of shot regions on the substrate by performing a first drive in the first direction with the first actuator and the second actuator, and a second drive in the second direction with the third actuator and the fourth actuator;
    causing the first actuator to apply the first thrust to the first side in a first orientation of the first direction and causing the second actuator to apply the second thrust to the second side in a second orientation opposite to the first orientation of the first direction to move the substrate stage in the first direction in the exposure period; and controlling the driving unit such that a total thrust of the first thrust and the second thrust changes according to a sine function by changing each of the first thrust and the second thrust, and any of a magnitude of the first thrust and a magnitude of the second thrust does not become 0 when an orientation of the total thrust changes in the first drive.

* * * * *